United States Patent
Tamura et al.

(10) Patent No.: US 8,673,086 B2
(45) Date of Patent: Mar. 18, 2014

(54) METHOD AND DEVICE FOR CLEANING A SUBSTRATE AND STORAGE MEDIUM

(75) Inventors: Akitake Tamura, Nirasaki (JP);
Akinobu Kakimoto, Nirasaki (JP);
Kazuya Dobashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 441 days.

(21) Appl. No.: 13/056,504

(22) PCT Filed: Jul. 27, 2009

(86) PCT No.: PCT/JP2009/063329
§ 371 (c)(1),
(2), (4) Date: Jan. 28, 2011

(87) PCT Pub. No.: WO2010/013661
PCT Pub. Date: Feb. 4, 2010

(65) Prior Publication Data
US 2011/0155177 A1    Jun. 30, 2011

(30) Foreign Application Priority Data
Jul. 31, 2008    (JP) .................................. 2008-198586

(51) Int. Cl.
*B08B 7/00*    (2006.01)

(52) U.S. Cl.
USPC ................. 134/19; 134/31; 134/34; 134/35

(58) Field of Classification Search
None
See application file for complete search history.

(56) References Cited

U.S. PATENT DOCUMENTS

| | | | |
|---|---|---|---|
| 6,565,920 B1 | 5/2003 | Endisch |
| 6,815,371 B2 | 11/2004 | Endisch |
| 7,237,562 B2 | 7/2007 | Shibayama |
| 2009/0081810 A1 | 3/2009 | Hamada et al. |

FOREIGN PATENT DOCUMENTS

| | | |
|---|---|---|
| JP | 2000 100686 | 4/2000 |
| JP | 2003 174001 | 6/2003 |
| JP | 2003 535483 | 11/2003 |
| JP | 2004 79990 | 3/2004 |
| JP | 2006 038472 | 4/2006 |
| JP | 2007-218894 | 8/2007 |

OTHER PUBLICATIONS

Office Action issued on Mar. 19, 2013 in the counterpart Japanese Application No. 2009-173600.
International Search Report issued Nov. 2, 2009 in PCT/JP09/063329 filed Jul. 27, 2009.

*Primary Examiner* — Eric Golightly
(74) *Attorney, Agent, or Firm* — Oblon, Spivak, McClelland, Maier & Neustadt, L.L.P.

(57) ABSTRACT

In a cleaning method, a substrate having a pattern formed on the surface thereof can be cleaned by using a cleaning fluid, while preventing the pattern protrusions from being flattened when the cleaning fluid is removed or dried. The cleaning method includes the steps of: loading a substrate onto a loading platform inside a processing chamber; heating the substrate; and supplying a cleaning fluid onto the surface of the substrate. The substrate is heated in the substrate heating step so that the Leidenfrost phenomenon occurs and steam of the cleaning fluid is interposed between the substrate and droplets of the cleaning fluid supplied to the substrate in the cleaning fluid supply step.

10 Claims, 17 Drawing Sheets

METHOD AND DEVICE FOR CLEANING A SUBSTRATE AND STORAGE MEDIUM

FIELD OF THE INVENTION

The present invention relates to a method and a device for cleaning a substrate used in manufacturing a semiconductor device, e.g., a semiconductor wafer, having a pattern formed on a surface thereof, and a storage medium storing the cleaning method.

BACKGROUND OF THE INVENTION

In a semiconductor device manufacturing process, a laminated structure of an integrated circuit is formed by repeating a pattern formation and a thin film formation on, e.g., a semiconductor wafer (hereinafter, referred to as a "wafer") as a substrate. The pattern forming process includes: forming a resist mask by photolithography; forming a pattern corresponding to the mask by performing, e.g., plasma etching, on an underlying thin film by using the mask; and performing ashing for carbonizing the resist mask by an $O_2$ containing plasma.

In the ashing process, residues of the resist mask are generated to remain on the surface of the thin film and/or inside the grooves of the pattern, for example. In order to remove the residues remaining on the surface of the wafer and/or inside the grooves by cleaning, a cleaning fluid is supplied onto the surface of the wafer after the ashing process. Specifically, in a single-wafer spin cleaning device, a cleaning fluid, e.g., pure water, is sprayed from a nozzle to the wafer surface while rotating the wafer. The residues are cleaned by the cleaning fluid while scanning the nozzle from the central portion of the wafer to the peripheral portion thereof. Next, the cleaning fluid remaining on the surface is scattered off by rotating the wafer or evaporated by heating the wafer. Hence, the cleaning fluid remaining on the wafer surface and inside the grooves is removed.

The pattern has various shapes in accordance with portions of a device. Specifically, a wiring pattern formed in an insulating film can be formed as a line-and-space pattern (a pattern in which a plurality of line-shaped protrusions and grooves are arranged in parallel with one another). The line-and-space pattern has an area of a high pattern density and an area of a low pattern density. FIG. 17A shows an example of such pattern. As described above, a surface of a wafer 100 has a high-density area 103 where lines 102 are densely disposed due to, e.g., grooves 101 having a small opening width, and a low-density area 104 where the lines 102 are separated by a the grooves 101 having a larger opening width than that in the high-density area 103. Reference numeral "105" in FIG. 17A indicates residues.

The cleaning fluid remaining on the surface of the wafer 100 after the cleaning process tends to become a substantially horizontal shape so as to reduce its surface area, e.g., in the grooves 101 due to surface tension. Accordingly, a horizontal force is applied to the lines 102 so as to pull the lines 102 toward the cleaning fluid (the grooves 101) due to the surface tension of the cleaning fluid. In the high-density area 103, the surface tension strongly acts due to the small gap between the lines 102 and, thus, it is difficult to remove (dry) the cleaning fluid remaining on the surface of the wafer 100. On the contrary, in the low-density area 104, the surface tension is weaker than that in the high-density area 103 due to the large gap between the lines 102 and, hence, the cleaning fluid in the low-density area 104 is removed (dried) faster than in the high-density area 103. As shown in FIG. 17B, if the cleaning fluid in the high-density area 103 remains while the cleaning fluid in the low-density area 104 is completely removed or remains at a small amount compared to that in the high-density area 103, the attractive force directed toward the high-density area 103 (left side in FIG. 17B) becomes larger than the attractive force directed toward the small-density area 104 (right side in FIG. 17B) in the line 102 located in the boundary between the areas 103 and 104.

Meanwhile, along with the trend toward high integration, there is often the case where the lines 102 have an extremely small width, smaller than about 100 nm, for example. Therefore, the strength of the lines 102 is decreased, and a porous low-k film (e.g., SiCOH film) formed of a porous material and serving as an interlayer insulating film becomes soft. When the attractive forces from both sides are not in equilibrium, the lines 102 collapse toward the side where the larger attractive force is applied (left side in FIG. 17C), as shown in FIG. 17C. In addition, the removal (drying) rate of the cleaning fluid is slightly different between, e.g., the grooves 101 in the areas 103 and 104 as well as between the opposite sides of the line 102 existing in the boundary of the areas 103 and 104. Thus, the lines 102 may collapse after the cleaning fluid is removed (dried) even in the areas 103 and 104 each of which has a uniform arrangement density of the lines 102.

The above resist mask as well as this low-k film may be formed as a mask pattern having a finer dimension compared to the above pattern, wherein, lines may have a width of, e.g., about 32 nm, and a height (depth of grooves) of, e.g., about 120 nm, and the grooves may have an opening dimension of, e.g., about 32 nm. When the mask pattern is formed on the resist mask by a developing process, an organic material forming the resist mask or residues of the organic material may remain on the surface of the mask pattern or inside the grooves of the mask pattern and, hence, the substrate needs to be cleaned after the developing process. Since, however, the resist mask formed of the organic material is of a low hardness, the lines may collapse during the removal (drying) of the cleaning fluid.

The pattern formed by, e.g., etching, may have a shape other than the elongated shape in which the lines 102 are extended along the surface of the substrate. For example, as shown in FIG. 18A, in a double-gate type fully depleted SOI-MOSFET, a columnar structure 110 such as a rectangular pillar for forming a channel on a top surface and a side surface thereof, a gate electrode for forming a double gate structure referred to as a "FIN-FET", or the like may be formed. Further, a cylindrical electrode 111 may be formed, e.g., on top of the gate electrode, as shown in FIG. 18B. A wafer 100 having such pattern may be subjected to a cleaning process in order to remove residues generated by, e.g., an etching process. When a cleaning fluid is removed (dried) in the cleaning process, protrusions (the structure 110 and the electrode 111) may collapse. If the width of the protrusions of the pattern is reduced along with the trend toward high-density of wiring, the problem of the collapse becomes more serious.

Here, there has been known a method for supplying an organic solvent, e.g., alcohol, which is easily removed (evaporated) due to its low boiling point, onto the surface of the wafer where the cleaning fluid remains, substituting the cleaning fluid remaining on the wafer for the organic solvent, and performing a drying process to remove moisture (the cleaning fluid and the organic solvent) from the surface of the wafer. However, in this method as well, when the organic solvent is removed or dried, the protrusions may collapse due to the surface tension of the organic solvent. Although the surface tension of the cleaning fluid can be reduced by mixing, e.g., a surfactant, with the cleaning fluid, the surfactant remaining on the cleaned wafer surface causes contamination of the wafer.

In addition, although a method for cleaning a wafer by supplying steam onto the surface of the wafer has been known, the steam is insufficient to remove the above-described residues. Besides, there has been known another method for cleaning a wafer by supplying a cleaning fluid in a mist form (droplets) onto the surface of the wafer. However, even if the cleaning fluid is supplied in a mist form, its surface tension still exists. Therefore, if the mist enters the grooves, for example, the horizontal force is applied to the lines. Moreover, if the mist is condensed on the wafer, the lines collapse during the drying process as in the case of the example of FIGS. 17A to 17C.

Furthermore, there has been known a cleaning method using a supercritical fluid obtained by applying an extremely high pressure to, e.g., carbon dioxide ($CO_2$), an organic solvent or the like. However, this method requires a high-pressure equipment and is not easy to be implemented into a device. Although a technique for cleaning a substrate while reducing surface tension of a cleaning fluid by heating the substrate or the cleaning fluid to a temperature within a range from about 50° C. to about 100° C. is described in JP6-196397A (paragraphs 0004 and 0005), such technique can slightly reduce the surface tension but is insufficient to solve the above-described problems.

SUMMARY OF THE INVENTION

In view of the above, the present invention provides a method and a device for cleaning a semiconductor device substrate having a pattern formed on a surface thereof by supplying a cleaning fluid onto the surface of the substrate while preventing pattern collapse, and a storage medium for storing therein this cleaning method.

In accordance with a first aspect of the invention, there is provided a substrate cleaning method including the steps of: loading a substrate having a pattern formed on a surface thereof onto a mounting table inside a processing chamber; heating the substrate; and supplying a cleaning fluid onto the surface of the substrate, wherein the substrate is heated in the substrate heating step so that the Leidenfrost phenomenon occurs and steam of the cleaning fluid is interposed between the substrate and droplets of the cleaning fluid supplied to the substrate in the cleaning fluid supply step.

In the cleaning fluid supply step, the cleaning fluid may be supplied onto the substrate while rotating the substrate about a vertical axis as an axis line. Further, the cleaning fluid may be supplied to the substrate in a mist form. In the substrate heating step, the substrate may be heated by a heating mechanism provided in the mounting table. Further, the substrate may be heated to a temperature within a range from about 140° C. to 300° C. in the substrate heating step, and water may be supplied as the cleaning fluid under the atmospheric atmosphere in the cleaning fluid supply step. The substrate cleaning method may further include, before supplying the cleaning fluid to the substrate, depressurizing the processing chamber. The cleaning fluid may be at least one of water and an organic solvent.

In accordance with a second aspect of the invention, there is provided a substrate cleaning method including the steps of: loading a semiconductor device substrate having a pattern formed on a surface thereof onto a mounting table inside a processing chamber; supplying a cleaning fluid onto the surface of the substrate, wherein, in the cleaning fluid supply step, a liquid having a boiling point lower than a temperature of the substrate is supplied as the cleaning fluid so that the Leidenfrost phenomenon occurs and steam of the cleaning fluid is interposed between the substrate and droplets of the cleaning fluid supplied to the substrate.

The cleaning fluid may be selected from a group consisting of liquid nitrogen, liquid argon, liquid oxygen, liquid krypton, liquid xenon and liquid carbon dioxide. In the cleaning fluid supply step, the cleaning fluid may be supplied onto the substrate while rotating the substrate about a vertical axis as an axis line. The cleaning fluid may be supplied to the substrate in a mist form. The substrate cleaning method may further include, before supplying the cleaning fluid to the substrate, depressurizing the processing chamber.

In accordance with a third aspect of the invention, there is provided a substrate cleaning device including: a processing chamber having therein a mounting table configured to mount thereon a semiconductor device substrate having a pattern formed on a surface thereof; a cleaning fluid supply member for supplying a cleaning fluid for cleaning the substrate to the substrate mounted on the mounting table; and a heating mechanism for heating the substrate mounted on the mounting table so that the Leidenfrost phenomenon occurs and steam of the cleaning fluid is interposed between the substrate and droplets of the cleaning fluid supplied to the substrate.

The substrate cleaning device may further include a rotation mechanism rotating the mounting table about a vertical axis. The cleaning fluid supply member may be configured to supply the cleaning fluid in a mist form. The heating mechanism may be provided in the mounting table.

In accordance with a fourth aspect of the invention, there is provided a substrate cleaning device including: a processing chamber having therein a mounting table configured to mount thereon a semiconductor device substrate having a pattern formed on a surface thereof; and a cleaning fluid supply member for supplying a cleaning fluid for cleaning the substrate to the substrate mounted on the mounting table, wherein the cleaning fluid supply member supplies a liquid having a boiling point lower than a temperature of the substrate mounted on the mounting table so that the Leidenfrost phenomenon occurs and steam of the cleaning fluid is interposed between the substrate and droplets of the cleaning fluid supplied to the substrate.

The cleaning fluid may be selected from a group consisting of liquid nitrogen, liquid argon, liquid oxygen, liquid krypton, liquid xenon and liquid carbon dioxide. The substrate cleaning device may further include a rotation mechanism rotating the mounting table about a vertical axis. The cleaning fluid supply member may be configured to supply the cleaning fluid in a mist form.

In accordance with a storage medium storing therein a program executed by a control unit for controlling a cleaning device, wherein the program may be executed by the control unit to thereby control the cleaning device to perform the cleaning method in accordance with the first aspect of the invention.

In accordance with a storage medium storing therein a program executed by a control unit for controlling a cleaning device, wherein the program may be executed by the control unit to thereby control the cleaning device to perform the cleaning method in accordance with the second aspect of the invention.

In accordance with the present invention, when the semiconductor device substrate having a pattern formed on the surface thereof is cleaned by supplying the cleaning fluid onto the substrate, the substrate is heated such that the Leidenfrost phenomenon occurs and steam of the cleaning fluid is interposed between the substrate and droplets of the cleaning fluid.

When the cleaning fluid is supplied to the heated substrate, the droplets of the cleaning fluid float slightly from the substrate by the steam between the substrate and the droplets of the cleaning fluid. Hence, the contact between the cleaning fluid and the substrate is reduced, and the affect of the surface tension of the cleaning fluid on the substrate is eliminated or minimized. The steam is strongly ejected from the bottom of the droplets of the cleaning fluid toward the surface of the substrate, so that deposits, e.g., residues and the like, on the substrate are moved upward by the steam and absorbed by, e.g., the cleaning fluid. As a result, it is possible to clean the substrate while preventing collapse of the protrusions of the pattern.

DETAILED DESCRIPTION OF THE EMBODIMENT (Outline of Cleaning Process)

Figure 1A:
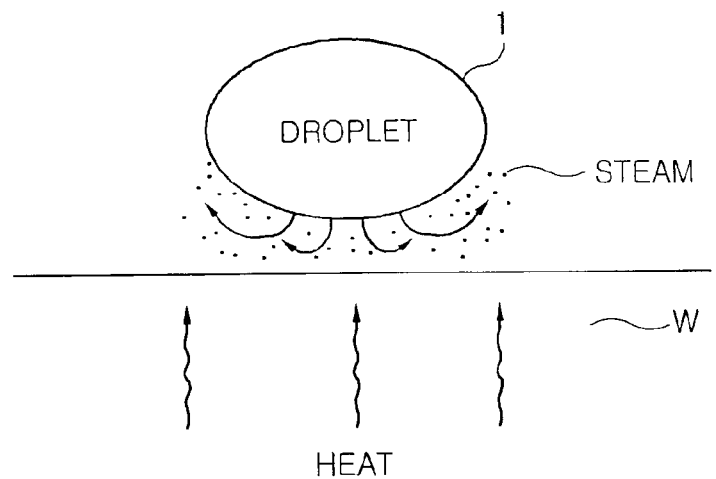
FIG. 1A schematically shows a droplet of a cleaning fluid in order to explain the Leidenfrost phenomenon.
Figure 8A:
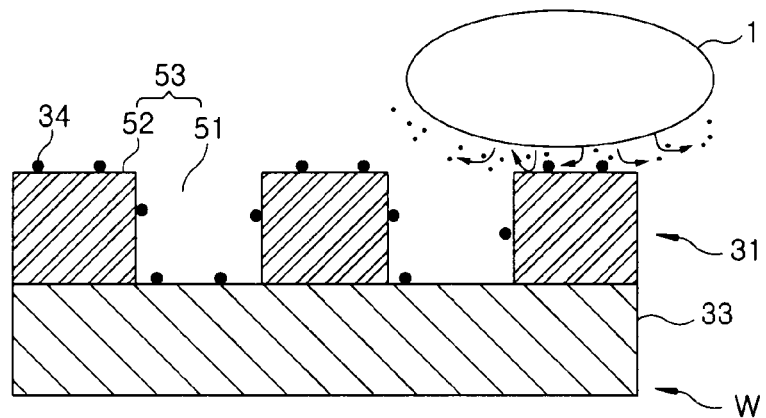
FIGS. 8A to 8C are vertical cross sectional views of the cleaned substrate.
Figure 8B:
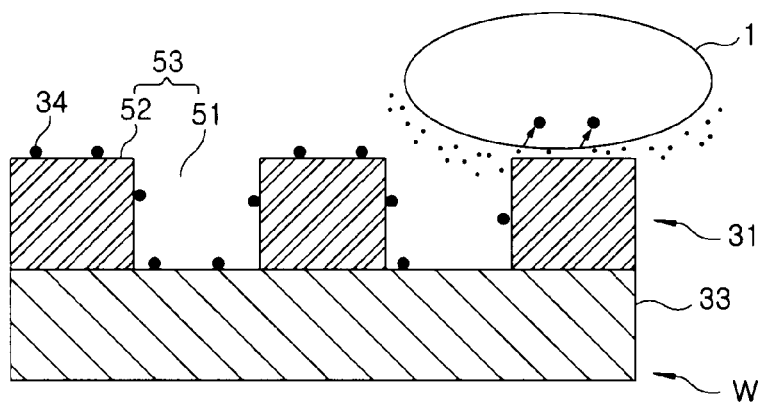
Figure 8C:
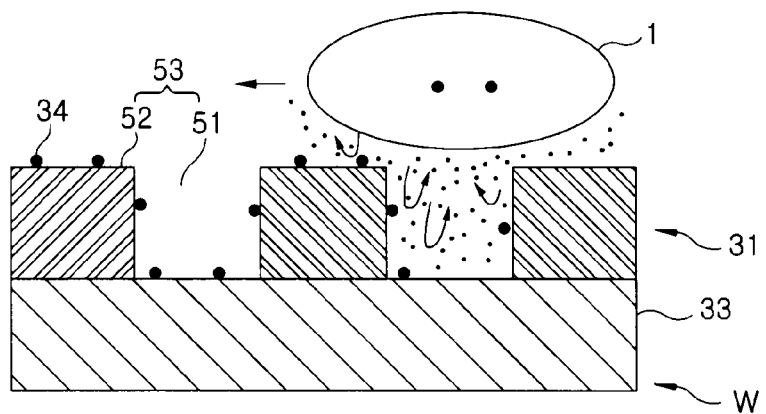

Hereinafter, an embodiment of the present invention will be described. A cleaning process to be described below is a process for supplying a cleaning fluid, e.g., pure water, in a mist form, to a substrate used in manufacturing a semiconductor device, e.g., a semiconductor wafer (hereinafter, referred to as a "wafer") W, while preventing or minimizing the effect of the surface tension of the pure water on the wafer W by using the Leidenfrost phenomenon occurring on the wafer W. The Leidenfrost phenomenon occurs when a drop of water falls on a hot frying pan, for example. As shown in FIG. 1A, when the wafer W is heated to a temperature higher than the boiling point of the cleaning fluid, a droplet 1 of the cleaning fluid supplied onto the wafer W is suddenly heated and the steam of the droplet 1 is interposed between the surface of the wafer W and the droplet 1. The steam is strongly ejected from the bottom of the droplet 1 to the surface of the wafer W and heated by the heat of the wafer W. Accordingly, the steam becomes light-weighted and is moved upward and absorbed by the droplet 1 or diffused upward from the periphery of the droplet 1. In the present embodiment, as the terms used for the cleaning fluid, e.g., pure water, steam is a gas, the droplet 1 indicates a state in which the cleaning fluid remains on the pattern 53, as shown in FIGS. 8A to 8C to be described later, and mist indicates the state in which a large amount of droplets 1 are ejected. In the present invention, in order to clean the wafer W while using the Leidenfrost phenomenon, the cleaning fluid is supplied to the wafer W in the form of droplet 1 or mist.

Figure 1B:
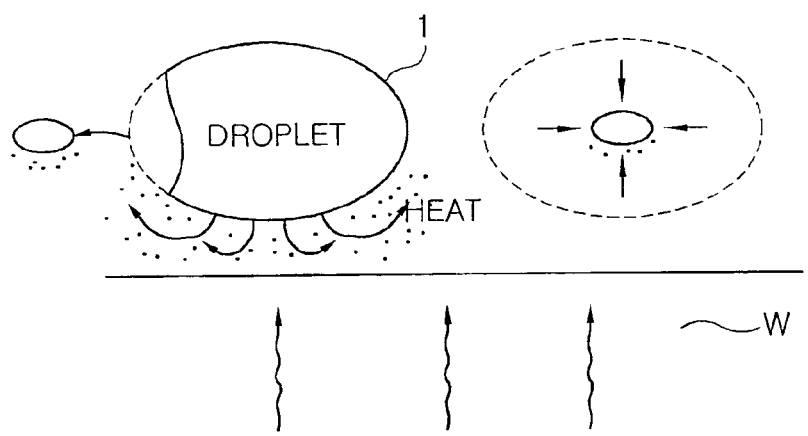
FIG. 1B schematically shows a droplet of a cleaning fluid in order to explain the Leidenfrost phenomenon.
Figure 2:
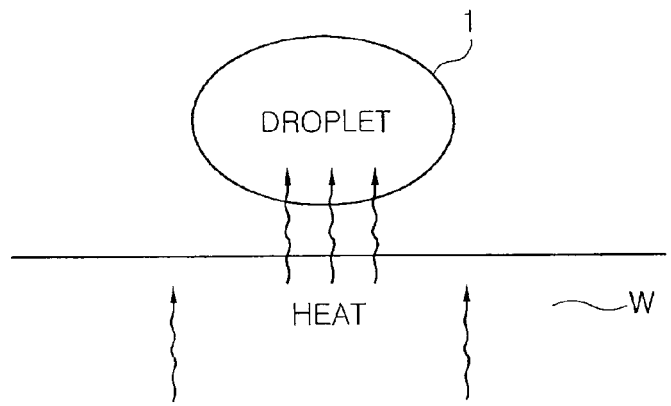
FIG. 2 schematically shows a droplet of a cleaning fluid in order to explain the Leidenfrost phenomenon.

The droplet 1 floats slightly from the wafer W by the steam interposed between the wafer W and the droplet 1. Hence, as will be described later, when a pattern 43 or 53 (see FIGS. 6A to 6C) is formed on the surface of the wafer W, the cleaning fluid does not enter the pattern 43 or 53. Even if the cleaning fluid enters the pattern 43 or 54, it is instantly evaporated or splashed out. Accordingly, the horizontal force by the surface tension of the cleaning fluid interposed between the lines 102, which has been described in "Background of the invention", is not applied to lines 42 or 52. Further, the heat of the wafer W is transferred to the droplet 1 via the steam interposed between the wafer W and the droplet 1, so that the transfer of the heat from the wafer W to the droplet 1 is slow compared to when the wafer W is in direct contact with the droplet 1. Therefore, the droplet 1 is not evaporated instantly, but evaporated slowly. At this time, as shown in the right side of FIG. 1B, the droplet 1 remains on the wafer W for a long period of time while becoming smaller in size. Further, as shown in the left side of FIG. 1B, a part of the droplet 1 may be split into smaller droplets 1 on the wafer W. In that case as well, steam of the droplet 1 is interposed between the smaller droplet 1 and the wafer W. Although the steam is a gas and invisible unless condensed, FIGS. 1A and 1B provide schematic illustration of the steam. This will be applied to the following drawings. Meanwhile, when the wafer W has a temperature at which the Leidenfrost phenomenon does not occur, e.g., a temperature lower than a boiling temperature of the cleaning fluid, no steam is interposed between the droplet 1 and the wafer W and, thus, the wafer W is in direct contact with the droplet 1 as shown in FIG. 2. Accordingly, the heat of the wafer W is directly transferred to the droplet 1, which leads to instant evaporation of the droplet 1.

Figure 3:
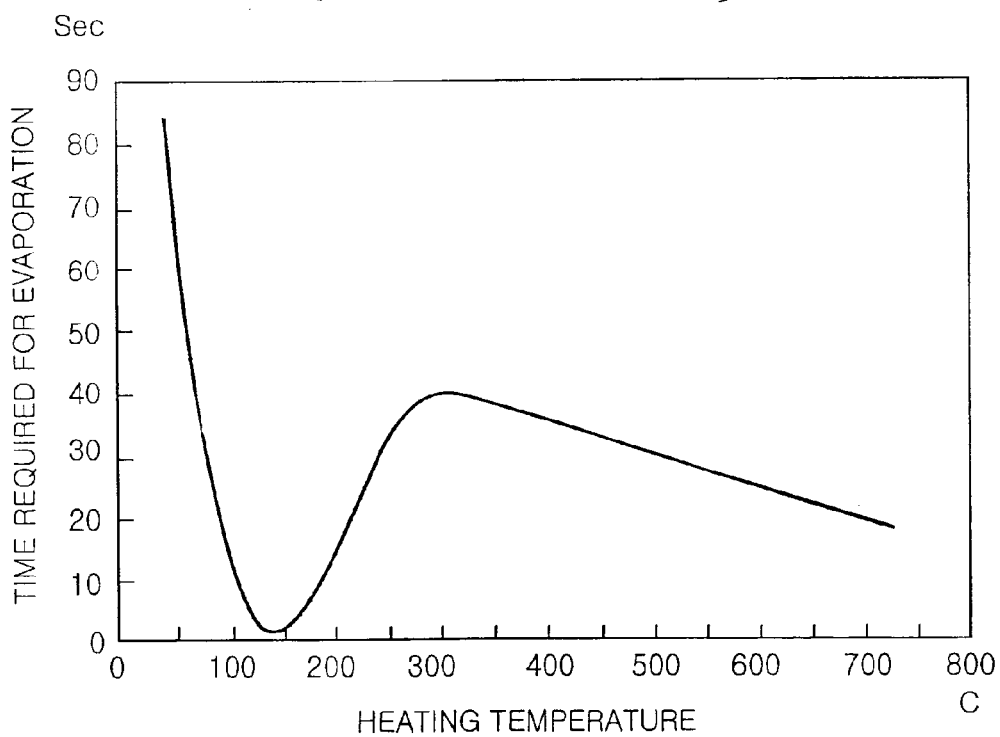
FIG. 3 presents a characteristic graph for explaining conditions in which the Leidenfrost phenomenon occurs.

The Leidenfrost phenomenon may not occur depending on the conditions, e.g., a temperature, a pressure and the like. Further, such conditions are changed depending on a type of liquid used as the cleaning fluid. Thus, in order to clean the wafer W by using such phenomenon, the temperature at which such phenomenon occurs needs to be examined. Specifically, the wafer W is heated to a predetermined temperature and, then, a predetermined amount of droplets 1 used as a cleaning fluid are dropped on the wafer W. Next, the time required until the droplets 1 are completely removed is measured. By performing the same measurement while changing the temperature of the wafer W, it is possible to recognize changes in the time required for evaporation of the droplet 1 at different temperatures. FIG. 3 shows the result of the measurement performed at an atmospheric pressure by using pure water, which is described in, e.g., page 332 of [Introduction to Heat Transfer] published in 1964 by YOKENDO. As shown in FIG. 3, in the temperature range lower than about the boiling point (100° C.) of the droplet 1, the time required for evaporation of the droplet 1 is gradually decreased as the temperature becomes higher, which indicates that the heat of the wafer W is directly transferred to the droplet 1. Hence, it is considered that, in such temperature range, the Leidenfrost phenomenon does not occur and the wafer W is in direct contact with the droplet 1.

Meanwhile, between about 140° C. and 300° C, the time required for evaporation of the droplet 1 is gradually increased as the temperature of the wafer W becomes higher. This is because, as described above, the steam of the droplet 1 which is interposed between the wafer W and the droplet 1 makes it difficult to transfer the heat of the wafer W to the droplet 1. It is considered that, in this temperature range, the thickness of the steam layer interposed between the wafer W and the droplet 1 is gradually increased as the temperature becomes higher. Therefore, it is found that, in this temperature range, the droplet 1 floats slightly from the wafer W and the collapse of the protrusions of the pattern of the wafer W is prevented or minimized.

Although it is considered that the Leidenfrost phenomenon also occurs at a temperature higher than or equal to about 300° C , it is preferable to clean the wafer W in the aforementioned temperature range (from about 140° C to 300° C ) in order to reduce the effect of the heat to the wafer W. When a resist or the like that is weak to the heat is cleaned, it is preferable to perform the cleaning at a low temperature close to the minimum value (about 140° C ) in such temperature range. Besides, as the pressure becomes lower (as the vacuum level is increased), the boiling point of the cleaning fluid is decreased, which makes the evaporation of the cleaning fluid easier. As the pressure becomes higher, the boiling point of the cleaning fluid is increased, which makes the evaporation of the cleaning fluid difficult. Hence, the pressure also needs to be controlled to a level at which the Leidenfrost phenomenon occurs.

(Device Configuration)

Figure 4:
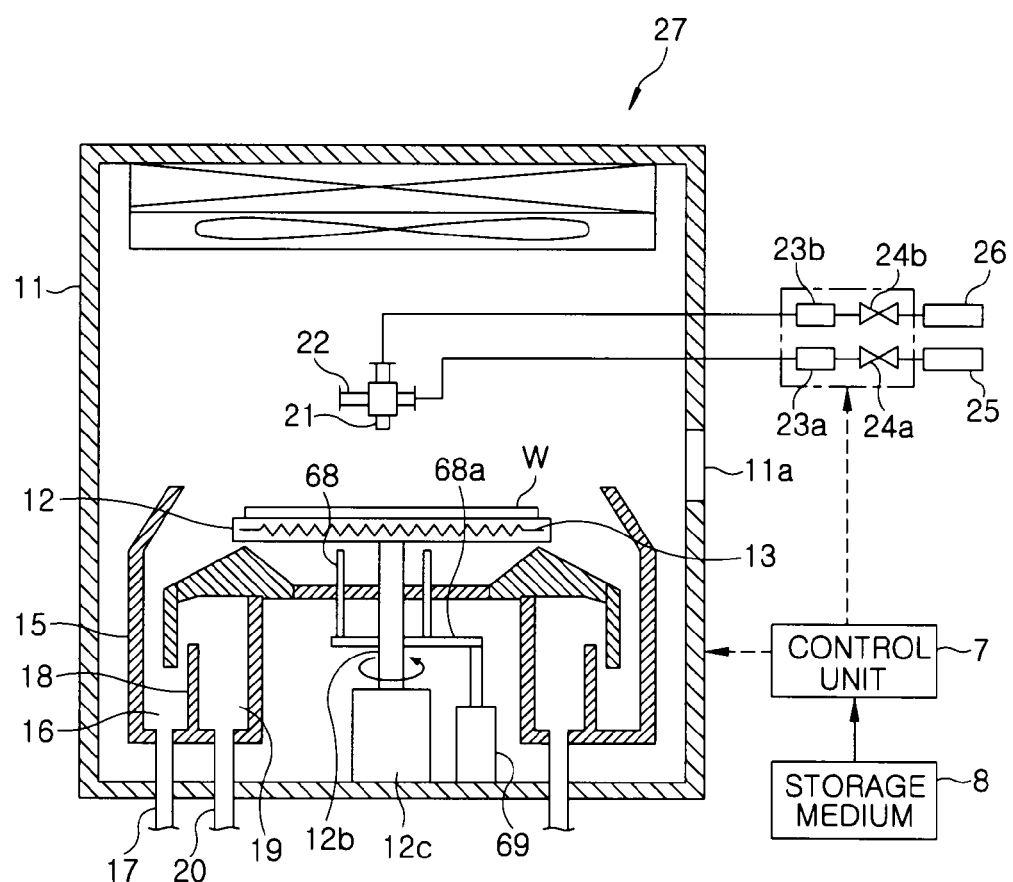
FIG. 4 is a vertical cross sectional view showing an example of a cleaning device for performing a cleaning method in accordance with an embodiment of the present invention.
Figure 5:
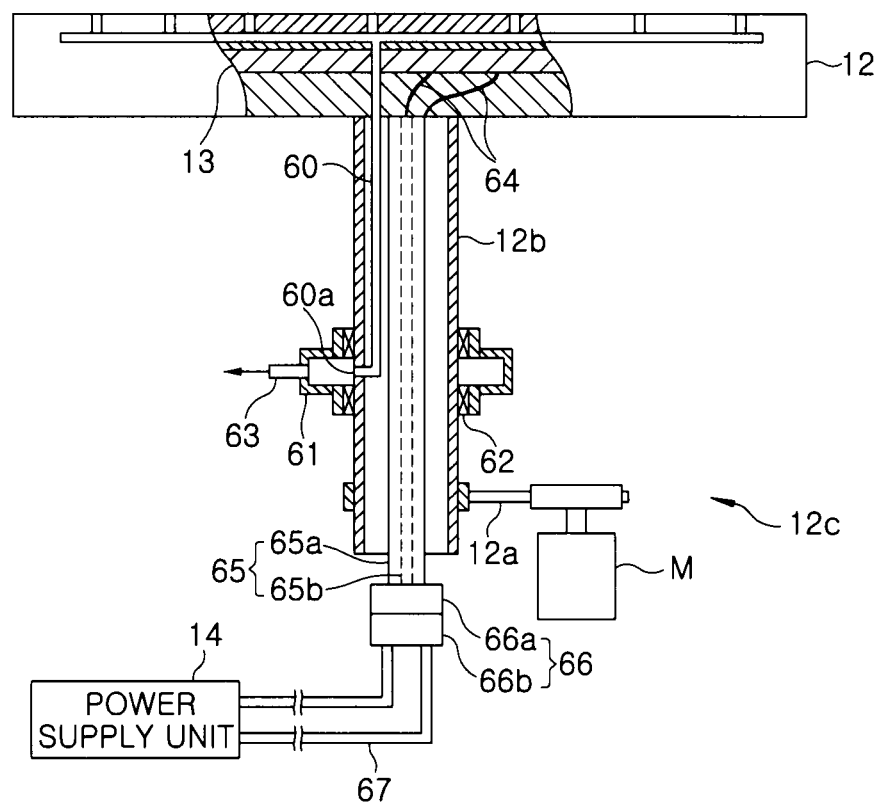
FIG. 5 is an enlarged view showing an example of a mounting table of the cleaning device of FIG. 4.

Hereinafter, an example of a cleaning device for cleaning a wafer W by using the Leidenfrost phenomenon will be briefly described with reference to FIGS. 4 and 5. The cleaning device includes a processing chamber 11 as a housing, and a mounting table 12 installed in the processing chamber 11. The mounting table 12 is rotatable about a vertical axis by a rotation mechanism 12c having a belt 12a serving as, e.g., a transmission mechanism, and a motor M via a hollow rotation shaft 12b. A heater 13 serving as a heating mechanism for heating the wafer W is buried in the mounting table 12.

One end section of a suction path 60 constituting a vacuum chuck for sucking and holding the wafer W from the backside thereof opens at a plurality of locations on the surface of the mounting table 12. The other end section of the suction path 60 extends in the rotation shaft 12b through the inside of the mounting table 12 and has a leading end portion that is horizontally bent to open to the outside at a side of the rotation shaft 12b. A hollow annular body 61 surrounding an intermediate portion of the rotation shaft 12b along a circumferential direction is provided around the rotation axis 12b to cover an opening 60a of the suction path 60 which opens at the side of the rotation axis 12b. The annular body 61 is fixed to, e.g., a bottom surface of the processing chamber 11, through a support (not shown). A bearing mechanism 62 having a magnetic sealing member or the like is airtightly disposed between the annular body 61 and the rotation axis 12b, so that the space communicating with the opening 60a (inner space of the annular body 61) can be airtightly maintained even when the rotation shaft 12b is rotated about the vertical axis.

One end of a suction tube 63 is connected to a side portion of the annular body 61, and the other end of the suction tube 63 is connected to a suction pump (not shown) or the like provided, e.g., outside the processing chamber 11. Due to the presence of the suction tube 63, the inner space of the annular body 61 and the suction path 60, the wafer W can be sucked from the backside thereof to be attracted and held on the mounting table 12 even during the mounting table 12 and the rotation shaft 12b are rotated about the vertical axis.

Provided in the rotation shaft 12b is a power supply shaft 65 extending coaxially with respect to the rotation shaft 12b from the bottom surface of the processing chamber 11 to the bottom side of the mounting table 12. An outer tube 65a and an inner axial portion 65b of the power supply shaft 65 are insulated so as not to electrically interfere with each other, and a pair of conductive paths 64 for supplying power to the heater 13 is connected to the upper ends of the outer tube 65a and the axial portion 65b of the power supply shaft 65. A connector 66 formed in, e.g., a substantially cylindrical shape, is connected to the lower end of the power supply shaft 65. The connector 66 has an upper rotatable portion 66a and a lower fixed portion 66b, the rotatable portion 66a and the fixed portion 66b being electrically connected to each other via, e.g., a conducive fluid or a conductive bearing. Therefore, the power supply shaft 65 is configured to be rotatable about the vertical axis together with the mounting table 12 and the rotatable portion 66a while being electrically connected to the connector 66.

A pair of cables 67 electrically connected to the outer tube 65a and the axial portion 65b is drawn through the bottom surface of the fixed portion 66b of the connector 66. The cables 67 are connected to a power supply unit 14, so that the wafer W can be heated to a predetermined temperature within a range from, e.g., about 140° C. to about 300° C., which makes the droplets 1 of the cleaning fluid on the wafer W subjected to the Leidenfrost phenomenon. FIG. 4 shows a simplified illustration of the mounting table 12.

The mounting table 2 has, e.g., elevating pins 68 for vertically moving the wafer W between a lower position at which the wafer W is mounted on the mounting table 12 and an upper position at which the wafer W is loaded and unloaded. The elevating pins 68 are connected to an elevation mechanism 69 provided, e.g., on the bottom surface of the processing chamber 11, via a support 68a. The wafer W is transferred between an external transfer unit (not shown) and the mounting table 12 through a transfer port 11a provided at the sidewall of the processing chamber 11 in a state where the elevating pins 68 are raised through holes (not shown) provided in the mounting table 12.

A substantially ring-shaped cup body 15 having an open top is provided in the processing chamber 11 to surround the mounting table 12 along the circumferential direction. A fluid receiving portion 16 for receiving the cleaning fluid falling from (scattering from) the circumferential edge of the wafer W is formed at the lower outer peripheral portion of the cup body 15 along the circumferential edge of the wafer W. A fluid discharge line 17 for discharging the cleaning fluid to the outside of the processing chamber 11 is connected to the bottom surface of the fluid receiving portion 16. A gas exhaust channel 19 partitioned from the fluid receiving portion 16 by a ring-shaped wall 18 is provided at the inner peripheral portion of the fluid receiving portion 16, and a gas exhaust line 20 for exhausting the atmosphere in the processing chamber 11 is connected to the bottom surface of the gas exhaust channel 19. The atmosphere in the processing chamber 11 is exhausted through a ring-shaped area between the cup body 15 and the circumferential edge of the wafer W, the fluid receiving portion 16, the gas exhaust channel 19 and the gas exhaust line 20.

A nozzle 21 serving as a cleaning fluid supply member for supplying a cleaning fluid, e.g., pure water, in a mist form to the wafer W mounted on the mounting table 12 is provided above the mounting table 12 to face the mounting table 12. The nozzle 21 is supported by an arm 22 that can be moved horizontally by a moving mechanism (not shown). For example, the nozzle 21 can horizontally move from the position above the central portion of the wafer W on the mounting table 12 toward the outer peripheral portion thereof.

The nozzle 21 is connected to a cleaning fluid supply unit 25 storing therein a cleaning fluid, e.g., pure water, via a flow rate control unit 23a and a valve 24a, and also connected to a carrier gas supply unit 26 storing a carrier gas, e.g., $N_2$ gas, via a flow rate control unit 23b and a valve 24b. The nozzle 21 is configured to supply the cleaning fluid in a mist form to the wafer by atomizing the cleaning fluid through the carrier gas, for example. A filter unit 27 is provided at the ceiling wall of the processing chamber 11, and a downflow is formed in the processing chamber 11 by the filter unit 27, a gas exhaust port (not shown) provided outside the cup body 15, and the gas exhaust line 20.

The cleaning device is connected to a control unit 7 including a computer having, e.g., a CPU, a memory, a program and the like (all not shown). The program has steps (instructions) for outputting a control signal to each unit of the cleaning device to thereby allow the cleaning device to clean the wafer W. The program is stored in a storage medium 8 serving as a storage unit, e.g., a hard disk, a compact disk, a magneto-optical disk, a memory card or the like, and installed from the storage medium 8 to the computer.

(Wafer Structure)

Figure 6A:
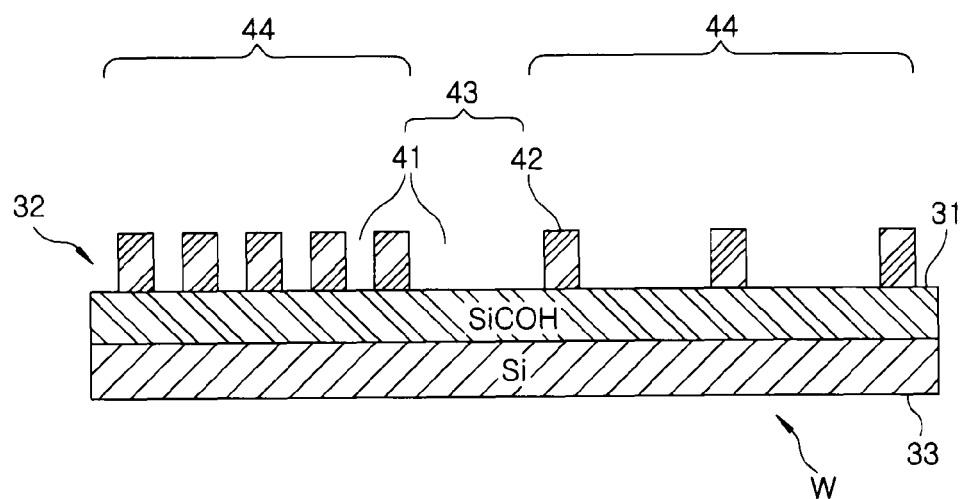
FIGS. 6A to 6C are vertical cross sectional views for explaining an example of a substrate to be cleaned.

Hereinafter, a wafer W to be cleaned by a cleaning method of the present embodiment will be described with reference to FIGS. 6A to 6C. As shown in FIG. 6A, the wafer W has a structure in which a low-k film 31 as an interlayer insulating film formed of, e.g., a silicon compound ($SiO_2$ or SiCOH) or the like, and a photoresist film 32 having a pattern 43 formed of a plurality of grooves 41 and lines 42 as protrusions extending between the grooves 41 are laminated in that order from the bottom on a silicon layer 33. Moreover, the wafer W has a high-density area 44 where the lines 42 are densely arranged due to a small opening width of the grooves 41 and a low-density area 45 where the lines 42 are sparsely arranged and separated by a large opening width of the grooves 41. FIG. 6A schematically shows the dimension of the pattern 43, which will be applied to FIGS. 6B, 6C, 8A to 11, and 13 to 14B.

Figure 6B:
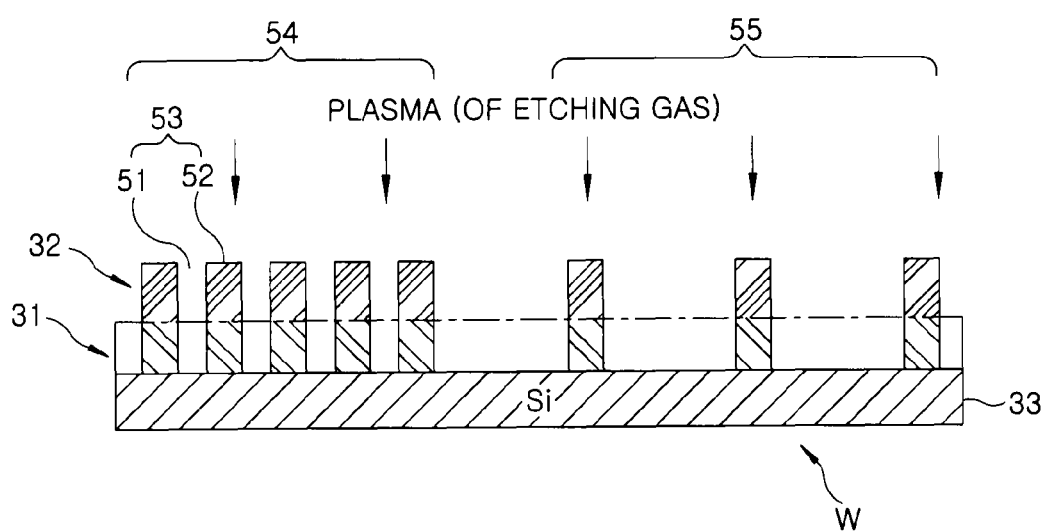
Figure 6C:
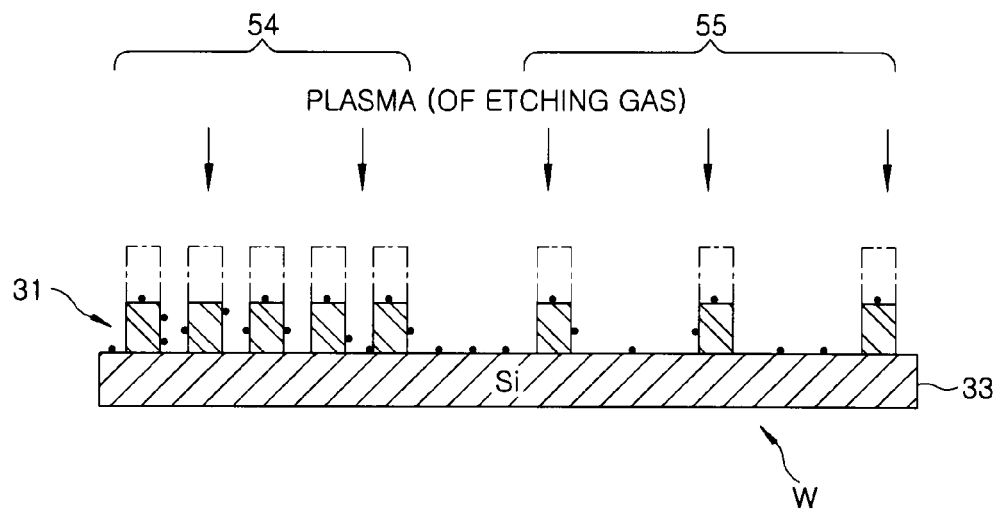

In the wafer W having the above configuration, the low-k film 31 is etched by, e.g., a parallel plate type plasma etching apparatus (not shown), by using a plasma of an etching gas containing carbon and fluorine and a dilution gas such as Ar gas or the like, as shown in FIG. 6B. As a result of the etching process, a pattern 53 formed of grooves 51 and lines 52 and having the shape corresponding to that of the pattern 43 is formed on the low-k film 31 and, also, a high-density area 54 where the lines 52 are densely arranged and a low-density area 55 where the lines 52 are sparsely arranged are generated. In this pattern 53, the lines 52 have a width of, e.g., about 90 nm, and a height (depth of the grooves 51) of, e.g., about 90 nm. The gap (opening dimension of the grooves 51) between the lines 52 is, e.g., about 90 nm in the high-density area 54 and about 270 nm in the small-density area 55.

Next, $O_2$ gas and a dilution gas are turned into a plasma, and an ashing process is performed by supplying the plasma to the wafer W. Hence, an unnecessary photoresist film 32 remaining on top of the low-k film 31 is removed as shown in FIG. 6C. As a result of the ashing process, residues 34 of the photoresist film 32 remain on the surface of the low-k film 31 and/or inside the grooves 51, as can be seen from FIG. 6C.

(Cleaning of Wafer)

Figure 7:
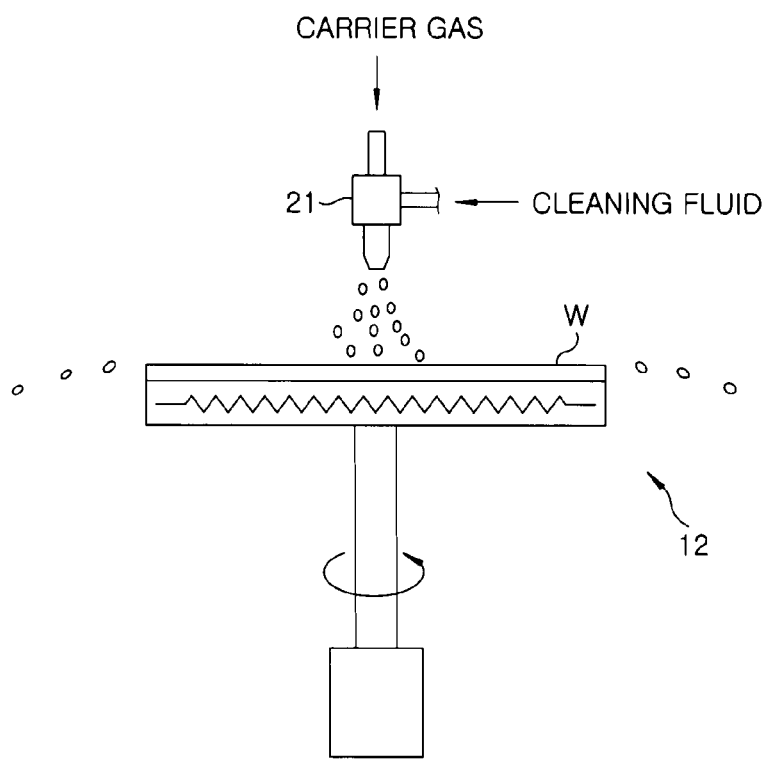
FIG. 7 is a schematic view showing a state in which the substrate is cleaned.

The residues 34 on the wafer W are removed (cleaned) as will be described below. First, in the above-described cleaning device, the wafer W is loaded into the processing chamber 11 by the external transfer unit (not shown) and mounted on the mounting table 12 by the cooperation of the elevation mechanism 69 and the transfer unit. The wafer W is attracted and held on the mounting table 12 by the suction of the suction path 60. Next, the wafer W is heated to a predetermined temperature within a range from, e.g., about 140° C. to about 300° C., preferably within a range from about 160° C to about 200° C , so that the Leidenfrost phenomenon can occur on the surface of the wafer W. Then, as shown in FIG. 7, the cleaning fluid is supplied in a mist form from the nozzle 21 to, e.g., the central portion of the wafer W while rotating the wafer W.

FIG. 8A shows an enlarged view of the pattern 53 formed on the surface of the wafer W. As described above, the droplet (mist) 1 of the cleaning fluid supplied onto the surface of the wafer W is heated so that the Leidenfrost phenomenon can occur. Therefore, the steam of the droplet 1 is interposed between the droplet 1 and the surface of the wafer W (the low-k film 31), as shown in FIG. 8A. Accordingly, the droplet 1 floats slightly from the surface of the wafer W, and the surface tension by the contact between the droplet 1 and the wafer W is eliminated or minimized. The steam interposed between the droplet 1 and the wafer W is strongly ejected from the bottom surface of the droplet 1 toward the surface of the wafer W, so that the residues 34 on the surface of the wafer W (surfaces of the lines 52) are moved upward by the flow of the steam and absorbed into the droplet 1, as can be seen from FIG. 8B.

Due to the rotation of the wafer W, the droplet 1 of the cleaning fluid supplied onto the surface of the wafer W is moved from the central portion toward the peripheral portion by the centrifugal force. And, for example, when the droplet 1 reaches the position above the grooves 51, the steam is strongly ejected from the bottom surface of the droplet 1 toward the surface of the wafer W (bottom surfaces of the grooves 51), as shown in FIG. 8C. As a consequence, the residues 34 remaining inside the grooves 51 are moved upward by the flow of the steam and absorbed into the droplet 1, as can be seen from FIG. 9A.

Figure 9A:
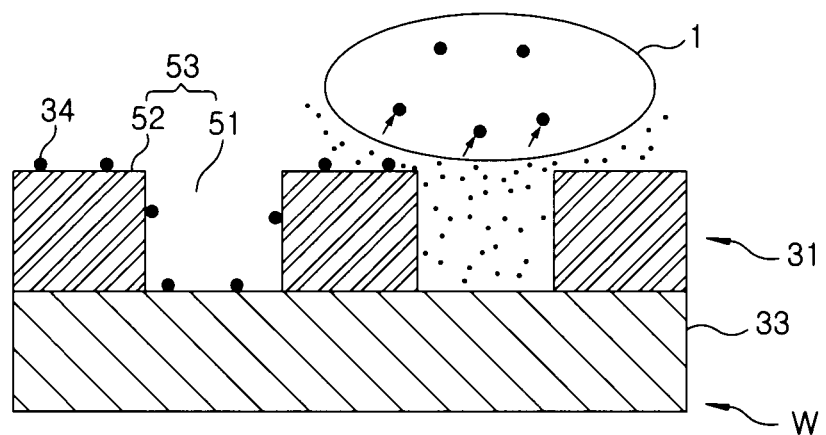
FIGS. 9A and 9B are vertical cross sectional views of the cleaned substrate.
Figure 9B:
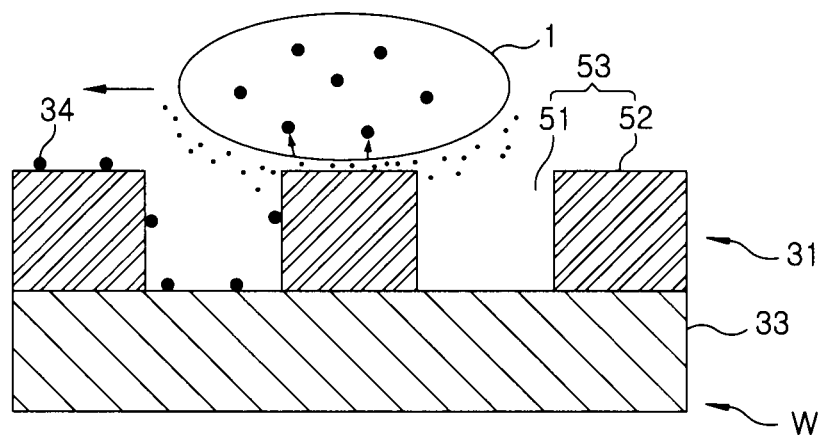

The actual size of the droplet 1 is considerably larger than the size shown in FIGS. 8A to 9B, and the actual size of the pattern 53 is considerably smaller than the size shown in FIGS. 8A to 9B. Therefore, the height difference between the surface of the wafer W (the top surfaces of the lines 52) and the bottom surfaces of the grooves 51 is small enough to be neglected compared to the size of the droplet 1 or the thickness of the steam layer generated below the droplet 1. Therefore, the residues 34 on the surface of the wafer W and the bottom surfaces of the grooves 51 are absorbed into the droplet 1 by the steam ejected from the bottom surface of the droplet 1. The droplet 1 is moved from the central portion of the wafer W toward the peripheral portion thereof, and the residues 34 are absorbed into the droplet 1 by the steam ejected from the bottom surface of the droplet 1, as shown in FIG. 9B.

At this time, the wafer W is heated so that the Leidenfrost phenomenon can occur on the wafer W, and the heat transfer from the wafer W to the droplet 1 is interfered by the steam interposed between the wafer W and the droplet 1. Therefore, the droplet 1 that has absorbed the residues 34 is not evaporated immediately after being dropped onto the wafer W. Further, since the surface tension is eliminated or minimized by heating the wafer W, the droplet 1 easily rolls over the wafer W. Accordingly, the droplet 1 that has absorbed the residues 34 is moved by the centrifugal force to be scattered from the circumferential edge of the wafer W.

Figure 10A:
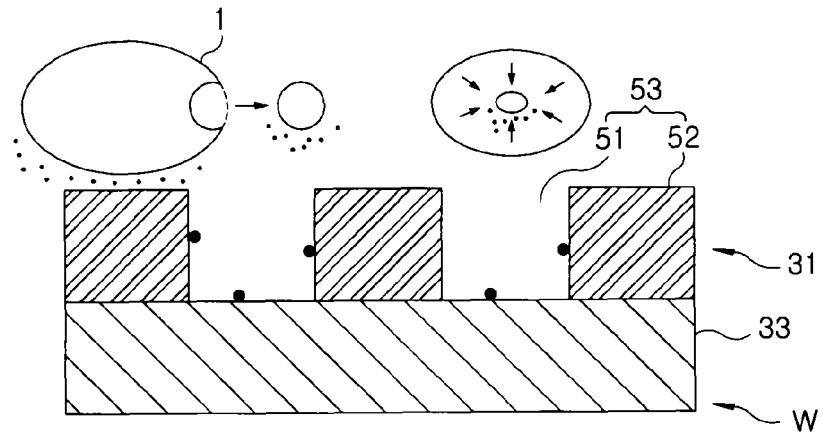
FIGS. 10A to 10C are vertical cross sectional views of the cleaned substrate.
Figure 10B:
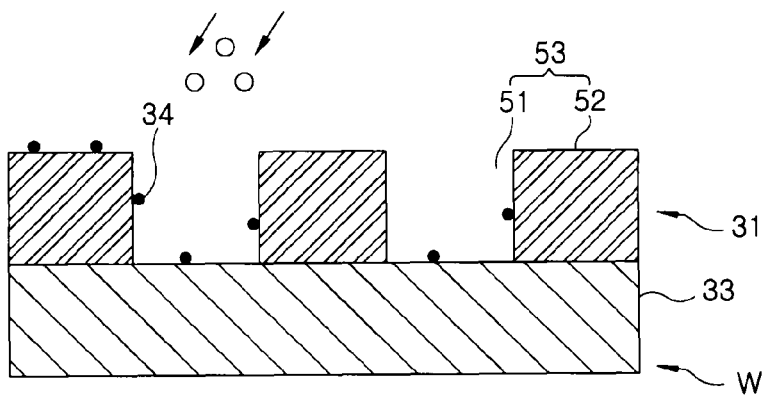
Figure 10C:
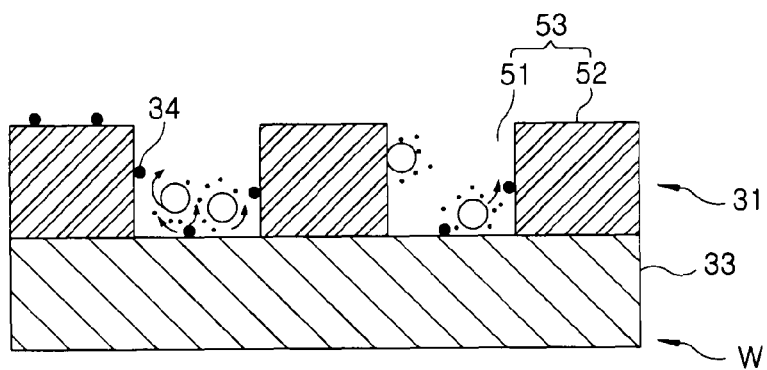
Figure 11:
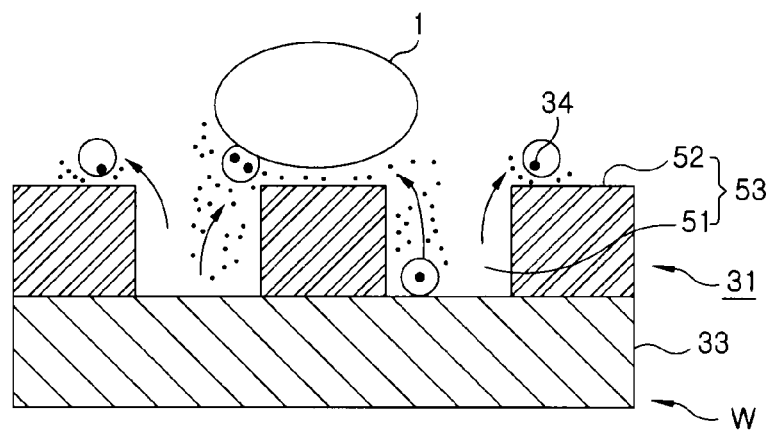
FIG. 11 is a vertical cross sectional view of the cleaned substrate.

Meanwhile, the droplet 1 may become smaller in size before being scattered from the circumferential edge of the wafer W as shown in the right side of FIG. 10A, or may be divided into small droplets 1 as shown in the left side of FIG. 10A. Moreover, the droplet 1 may have an extremely small size at the moment of being discharged from the nozzle 21 as shown in FIG. 10B. In that case as well, when the droplet 1 reaches the surface of the wafer W, a layer of steam is formed between the droplet 1 and the wafer W. Hence, if the droplets 1 are smaller than, e.g., the opening width of the grooves 51, the droplets 1 enter the grooves 51 and absorb the residues 34 in the grooves 51 by the steam ejected from the bottom surface of the droplets 1, as can be seen from FIG. 10C. When a following large droplet 1 rolls over the grooves 51, the small droplets 1 are moved upward by the steam ejected from the bottom surface of the larger droplet 1 and absorbed into the large droplet 1 together with the residues 34, as shown in FIG. 11.

Figure 12:
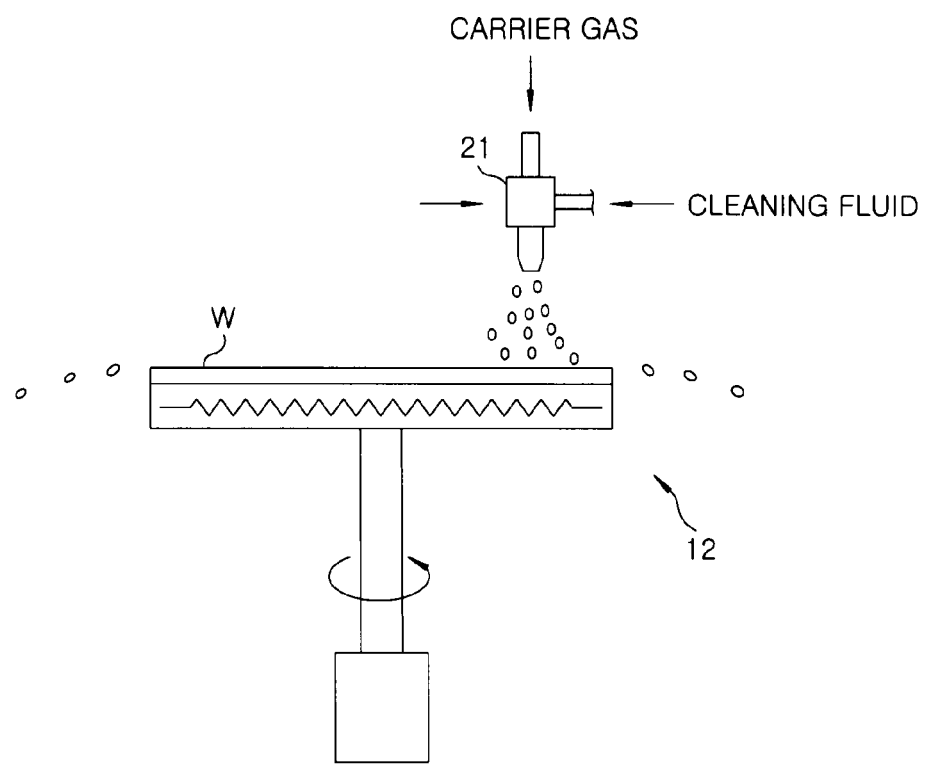
FIG. 12 is a schematic view showing a state in which the substrate is cleaned.
Figure 13:
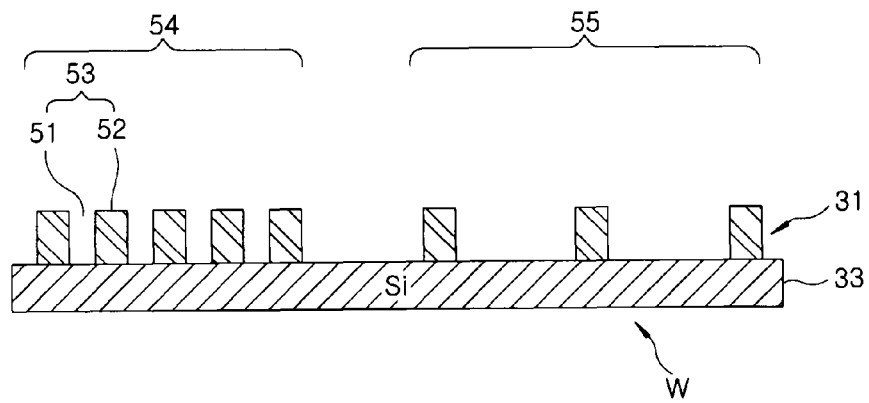
FIG. 13 is a vertical cross sectional view of an example of the cleaned substrate.

As shown in FIG. 12, the cleaning of the entire surface of the wafer W (the removal of the residues 34) is performed by moving the nozzle 21 from the central portion of the wafer W toward the peripheral portion thereof while supplying the cleaning fluid. Since the droplet 1 floats from the wafer W by the Leidenfrost phenomenon, it is possible to remove the residues 34 while preventing collapse of the lines 52 in both of the high-density area 54 and the low-density area 55, as can be seen from FIG. 13.

If a rotational speed of the wafer W is excessively high, the buoyancy (centrifugal force) of the droplet 1 of the cleaning fluid is increased and, thus, the residues 34 may not be sufficiently absorbed. On the contrary, if the rotational speed is excessively low, the droplet 1 is removed before being scattered by the centrifugal force from the wafer W. Accordingly, it is preferable to set the rotational speed to a level at which the cleaning effect of the droplet 1 can be optimized. Specifically, it is preferably set to range from, e.g., about 200 rpm to about 1000 rpm.

In accordance with the above-described embodiment, when the wafer W is cleaned by removing the residues 34 remaining inside the grooves 51 and on the surface of the low-k film having the pattern 53 including the lines 52 as protrusions, the wafer W is heated so that the Leidenfrost phenomenon can occur on the wafer W, and the cleaning fluid is supplied to the heated wafer W. Accordingly, the steam of the droplet 1 is interposed between the droplet 1 of the cleaning fluid and the wafer W and the surface tension by the contact between the droplet 1 and the wafer W is eliminated or minimized. Meanwhile, the residues 34 on the surface of the wafer W are moved upward by the steam ejected from the bottom surface of the droplet 1 and absorbed into the droplet 1. Thus, the horizontal force applied to the lines 52 by the surface tension of the droplet 1 can be suppressed, and it is possible to remove the residues 34 while preventing the collapse of the lines 52 in both of the high-density area 54 and the low-density area 55. As a result, the collapse of the lines 52 can be prevented even when the lines 52 have an extremely small width and the low-k film 31 is soft due to its porous structure.

For example, if the wafer W is cleaned only by steam in a gas state, the residues 34 that have been moved upward by the steam may fall and remain on the surface of the wafer W, which leads to insufficient cleaning of the wafer W. Since, however, the steam can be supplied to the wafer W from the droplet 1 positioned immediately above the wafer W by using the Leidenfrost phenomenon, the residues 34 moved upward by the steam can be absorbed into the droplet 1, which results in the complete removal of the residues 34. Further, it is unnecessary to mix the cleaning fluid with, e.g., a surfactant or the like for reducing the surface tension, so that the contamination of the wafer W can be suppressed. Moreover, in this cleaning device, the wafer W can be cleaned in a state where the processing chamber 11 is maintained at, e.g., an atmospheric pressure, so that it is unnecessary to provide an expensive high-pressure equipment.

Even in the etching process shown in FIG. 6B, by-products generated by reaction between the low-k film 31 and the plasma of the etching gas may remain as residues 34 on the surface of the wafer W. However, these residues 34 are also removed by the above-described cleaning method. Thus, the wafer W may be cleaned before the ashing process and may be cleaned again after the ashing process. The cleaning method of the present invention is also applicable to an etching process which is followed by no ashing process.

(Another Embodiment)

Although the case of removing the residues 34 remaining on the pattern 53 formed by patterning the low-k film 31 has been described in the above example, it is also possible to clean a wafer W having a pattern that includes protrusions having a small width and easily collapses by the surface tension of the cleaning fluid other than the pattern 53. This pattern may also be formed on the photoresist film 32 shown in FIG. 14A.

Figure 14A:
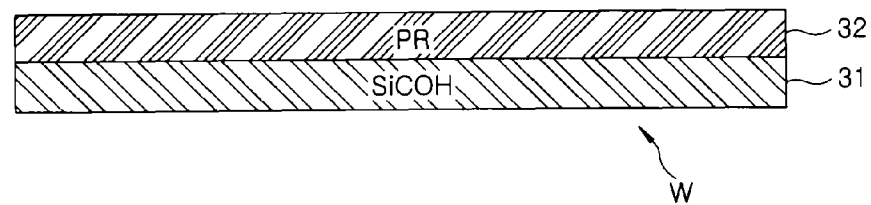
FIGS. 14A and 14B are vertical cross sectional views for explaining another example of a substrate to be cleaned.
Figure 14B:
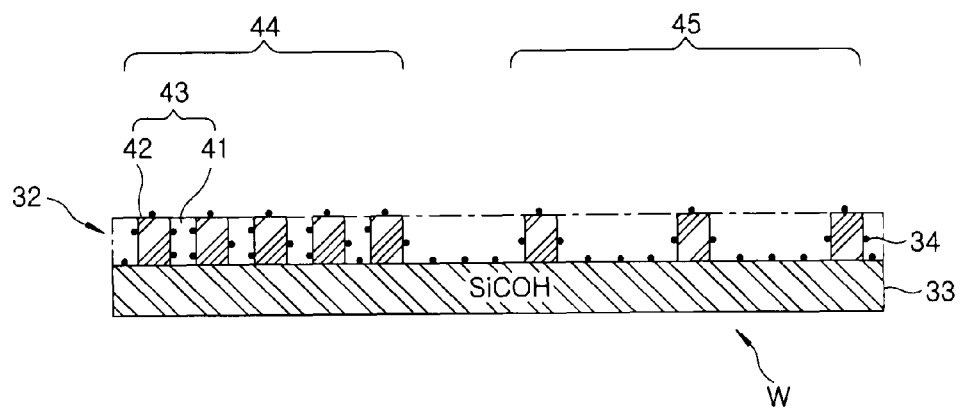

The pattern 43 of the photoresist film 32 is formed by the exposure process and the developing process. As shown in FIG. 14B, the organic material forming the photoresist film 32 and the like remain as the residues 34 on the surface of the wafer W and/or inside of the grooves 41 after the developing process. The pattern 43 may be formed in a finer dimension compared to the pattern 53. For example, the lines 42 may have a width of about 32 nm and a height (depth of the grooves 41) of about 120 nm, and the grooves 41 may have an opening dimension of about 32 nm. The lines 42 made of a soft organic material are extremely weak and easily collapse. By cleaning the wafer W having the pattern 43 by using the above cleaning method, it is possible to remove the residues 34 while preventing collapse of the lines 42 in both of the high-density area 44 and the low-density area 45.

Since the Leidenfrost phenomenon occurring on the photoresist film 32 and the states in which the residues 34 are being removed are the same as those in the above example, the redundant description thereof will be omitted. However, in order to reduce deterioration of the photoresist film 32 formed of an organic material, the heating temperature of the wafer W may be set to a level within a range from, e.g., about 60° C to about 100° C, which is lower than the heating temperature in the above example (from about 140° C to about 300° C ). Meanwhile, when pure water is used as the cleaning fluid, the wafer W needs to be heated to a temperature higher than the boiling temperature of the pure water so that the Leidenfrost phenomenon can occur on the surface of the wafer W. Hence, when the residues 34 on the photoresist film 32 are removed, the cleaning may be performed at a depressurized state, e.g., about 10 kPa to about 50 kPa, so that the cleaning fluid can be boiled at the above heating temperature (the boiling temperature thereof can be lowered).

An example of the cleaning device for cleaning the wafer W in a depressurized state will be described with reference to FIG. 15. This cleaning device has substantially the same configuration as that of the cleaning device shown in FIG. 4, and like reference numerals used in FIG. 4 designate like parts. Further, in order to depressurize the processing chamber 11, a depressurizing unit 70 such as a vacuum pump or the like is connected to, e.g., the gas exhaust line 20, via a pressure control unit 73 such as a butterfly valve or the like. Moreover, the elevation mechanism 69 and the rotation mechanism 12c are provided, e.g., outside (below) the processing chamber 11. Furthermore, extensible and contractible bellows 80 are provided between the elevation mechanism 69 and the bottom surface of the processing chamber 11 and between the rotation mechanism 12c and the bottom surface of the processing chamber 11. The atmosphere in the processing chamber 11 is airtightly maintained by the bellows 80.

Figure 15:
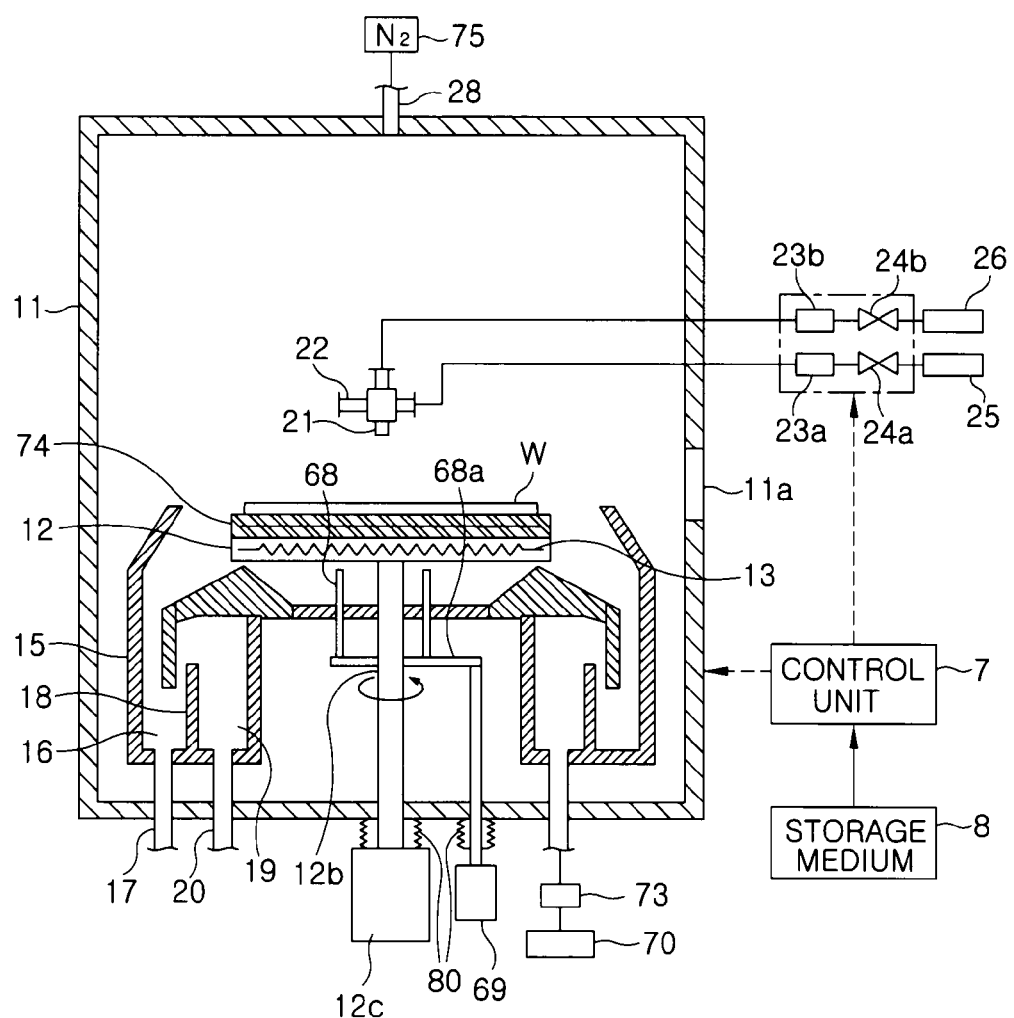
FIG. 15 is a vertical cross sectional view of another example of the cleaning device shown in FIG. 4.

When it is not possible to hold the wafer W by sucking the backside thereof, an electrostatic chuck 74 for electrostatically holding the wafer W may be provided, e.g., on the top surface of the mounting table 12, as shown in FIG. 15. In this case, the wafer W is attracted and held on the mounting table 12 by applying a high DC voltage from a power supply (not shown) to the electrostatic chuck 74. In this case, the method for supplying a power to the electrostatic chuck 74 or the heater 13 employs the configuration shown in FIG. 5. For example, the axial portion 65b of the power supply shaft 65 is used as a high voltage supply line for supplying a power to the electrostatic chuck 74 and a double pipe forming a pair of lines for supplying a power to the heater 13 is provided at the outer side thereof.

The aforementioned filter unit 27 is not provided in this processing chamber 11. Instead, one end of the gas supply line 28 for supplying a pure gas, e.g., $N_2$ or the like, into the processing chamber 11 is connected to the ceiling wall of the processing chamber 11, and the other end of the gas supply line 28 is connected to a gas supply unit storing therein the above gas via, e.g., a valve or a flow rate controller (not shown). When the atmosphere in the processing chamber 11 is substituted, $N_2$ gas or the like is supplied from the gas supply unit 75 into the processing chamber 11, and the atmosphere in the processing chamber 11 is sucked and exhausted by the depressurizing unit 70. Moreover, the transfer port 11a of the processing chamber 11 is airtightly sealed by, e.g., a gate valve (not shown). In this device as well, the wafer W is cleaned while controlling the heating temperature of the wafer W and the pressure in the processing chamber 11 such that the Leidenfrost phenomenon can occur on the wafer W and the deterioration of the photoresist film 32 can be reduced as in the above example. Accordingly, the same effects of the above example can be obtained.

Figure 16:
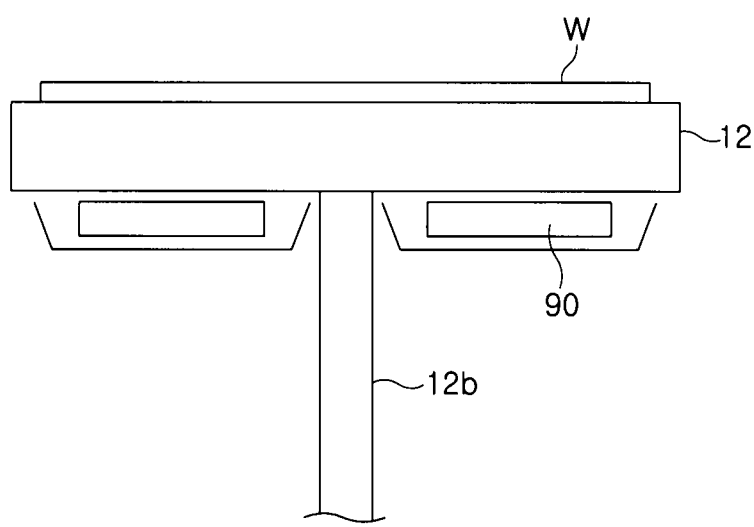
FIG. 16 is a side view of a modification of a heating mechanism of the cleaning device.
Figure 17A:
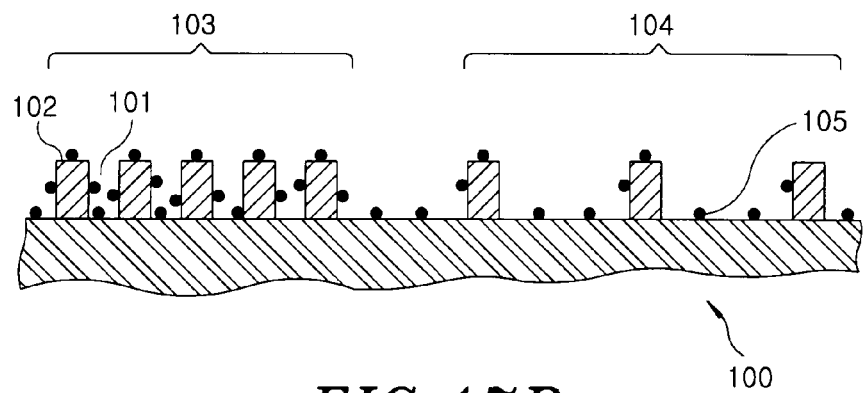
FIGS. 17A to 17C are vertical cross sectional views of a substrate cleaned by a conventional cleaning method.
Figure 17B:
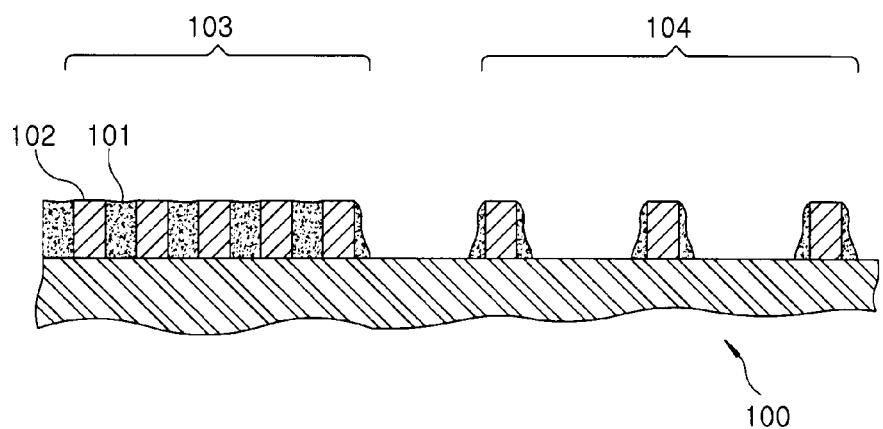
Figure 17C:
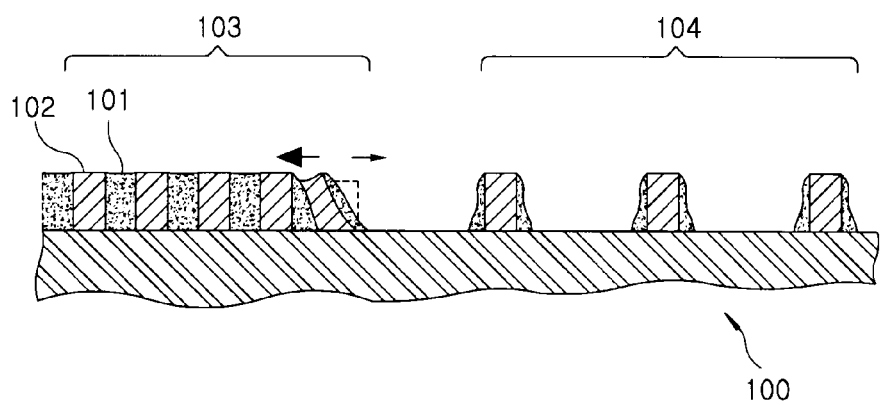

Even in the case of cleaning the low-k film 31, the heating temperature of the wafer W and the pressure in the processing chamber 11 can be controlled. Further, instead of heating the wafer W by the heater 13 provided at the mounting table 12, it is also possible to heat the wafer W from the backside thereof by a heating lamp 90 as a heating unit provided below the mounting table 12 along the circumferential direction, as shown in FIG. 16.

Figure 18A:
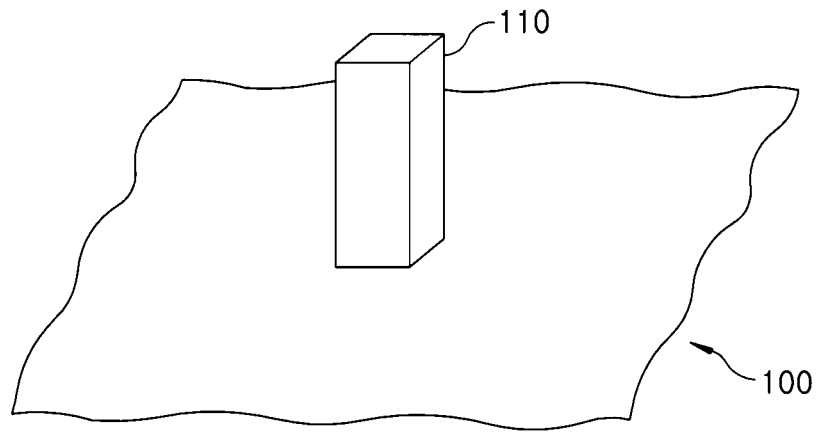
FIG. 18A is a perspective view of an example of a pattern formed on a surface of a substrate.
Figure 18B:
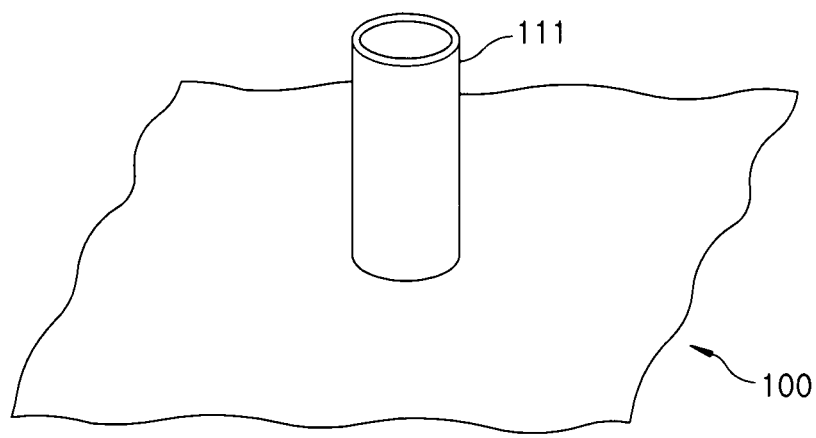
FIG. 18B is a perspective view of another example of the pattern formed on the surface of the substrate.

The present invention may be applied to a wafer having a pattern including easily collapsible protrusions other than the pattern including the grooves and the lines that are elongated as in the above examples. For example, this pattern may be a rectangular pillar for forming a channel on a top surface and a side surface thereof upon forming fully depleted SOI-MOSFET of a double gate type or the columnar structure 110 such as a gate electrode disposed to form a double gate structure referred to as "FIN-FET" shown in FIG. 18A, or the cylindrical electrode 111 formed, e.g., on top of the gate electrode, as shown in FIG. 18B. The collapsible protrusions refer to protrusions having a width or a length of, e.g., about 50 nm or less, and a height of, e.g., about 150 nm or more. In other words, it has an aspect ratio (ratio of the height to smaller one of the width and the length of the protrusions) of about 3 or more. The film on which this pattern is formed may be a metal, e.g., copper (Cu) or the like, polycrystalline silicon (Si) or the like, other than the low-k film 31 and the photoresist film 32.

The cleaning fluid may be, e.g., an organic solvent (ethanol, isopropyl alcohol (IPA) or the like). In that case, the Leidenfrost phenomenon occurs at a lower temperature, e.g., about 100° C. (at an atmospheric pressure), compared to the case of using pure water, so that the damage to the wafer W due to heat can be reduced. In order to further reduce the damage to the wafer W due to heat, a low-temperature liquid (liquid nitrogen, liquid argon, liquid oxygen, liquid krypton, liquid xenon, liquid carbon dioxide or the like) can be used as the cleaning fluid. In other words, the Leidenfrost phenomenon occurs by forming a steam layer on the interface between liquid (cleaning fluid) and solid (wafer W). A temperature range at which the steam layer is formed is defined as a "film boiling range". In this temperature range, a difference between the boiling point of the liquid and the temperature of the solid is greater than or equal to, e.g., about 100° C. Since the boiling point of the low-temperature liquid is extremely low, e.g., about minus hundred and several tens degrees Celsius, if the low-temperature liquid that has been cooled in advance to a liquid state is dropped or sprayed onto the wafer W at a room temperature, the low-temperature liquid is instantly evaporated by the heat of the wafer W. This allows the Leidenfrost phenomenon to occur and, thus, the wafer W can be cleaned as in the above examples. Hence, when the low-temperature liquid is used as the cleaning fluid, the wafer W can be cleaned even at a room temperature while using the Leidenfrost phenomenon. In that case, the cleaning device shown in FIG. 4 is provided with, instead of or in addition to the heater 13, a storage unit (the cleaning fluid supply unit 25) storing therein, e.g., the low-temperature liquid, which serves as a unit for supplying the low-temperature liquid to the nozzle 21. Even when the low-temperature liquid or the organic solvent is used as the cleaning fluid, the processing chamber 11 may be depressurized.

In the above examples, there has been described the case in which the cleaning fluid (droplet 1) does not contact with the surface of the wafer W (top surface of the pattern 43 or 53) and the inside of the pattern 43 or 53 due to the Leidenfrost phenomenon. However, if the cleaning fluid does not remain inside the pattern 43 or 53 after the cleaning of the wafer W, the lines 42 or 52 can be prevented from collapsing and, hence, the cleaning fluid may contact with the surface of the wafer W.

(Test Example)

The present invention will be described in more detail by using a test example. A test wafer was cleaned by supplying a cleaning fluid thereto under the conditions in which the Leidenfrost phenomenon occurs. The test wafer was manufactured by uniformly adhering particles having an average diameter of about 0.37 μm onto a wafer having particles of $SiO_2$. Pure water was supplied as the cleaning fluid to the test wafer heated to about 225° C. The processing time was set to about five minutes, and the pure water was supplied to the test wafer for five minutes. The pure water was supplied to the test wafer in the form of droplets having a size of about φ1 mm to about φ2 mm. During the processing, the droplets of the pure water supplied to the test wafer rolled on the test wafer.

Figure 19:
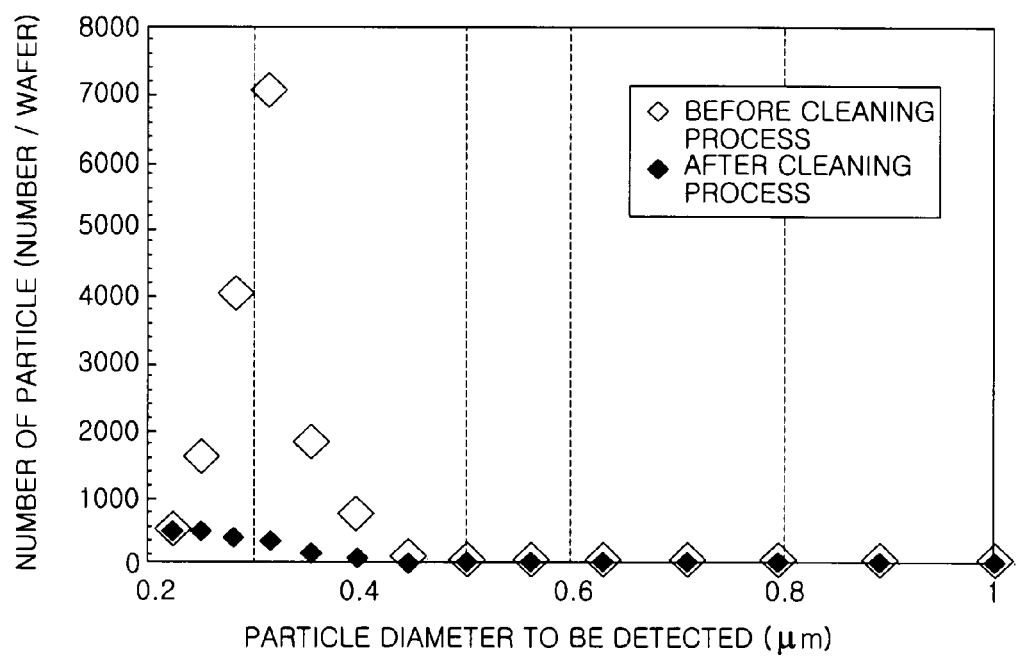
FIG. 19 is a graph showing the number of particles adhered onto a test wafer before and after a cleaning process.
Figure 20:
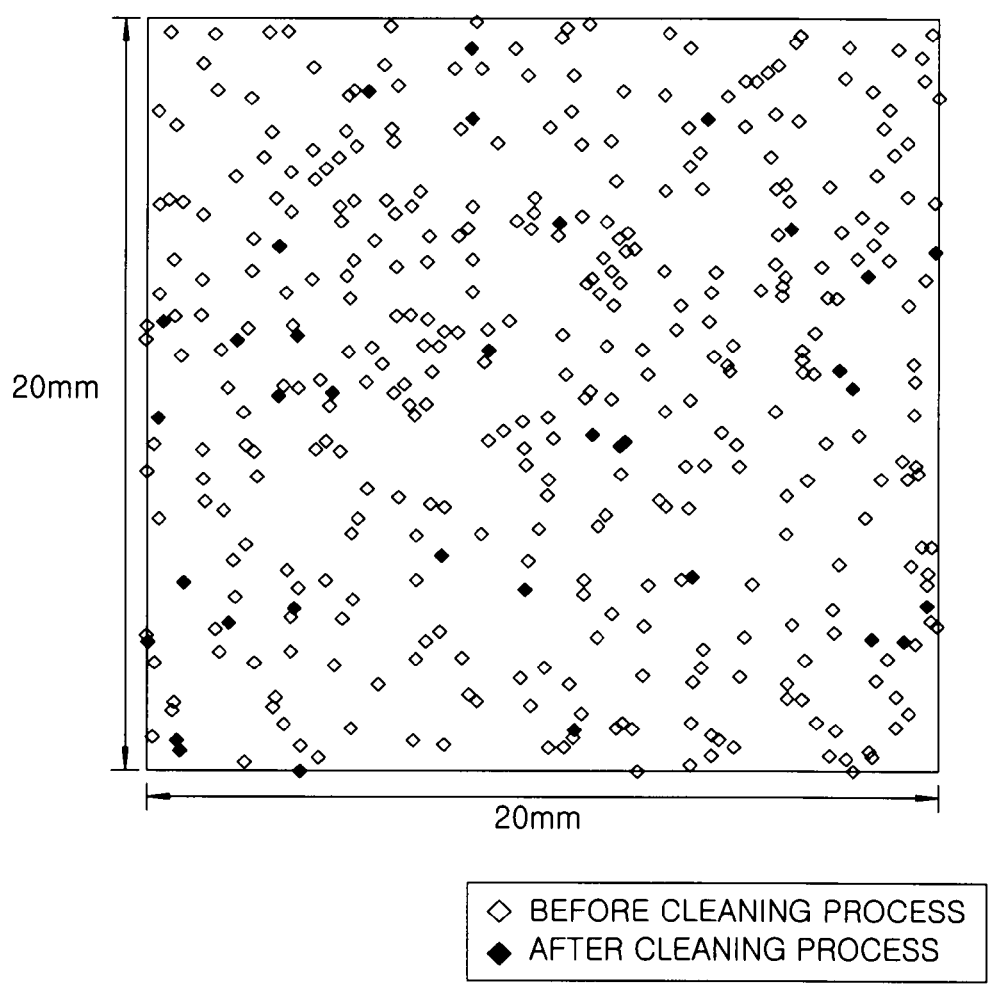
FIG. 20 shows positions of the particles adhered onto the test wafer before and after the cleaning process.

The number and positions of particles adhered onto the test wafer were measured before and after the cleaning process. The measurement was performed by using a light scattering-type defect detection device. The measurement results are shown in FIGS. 19 and 20. FIG. 19 shows the number of particles measured for each particle diameter, and FIG. 20 shows the positions of the particles within a 20 mm×20 mm area randomly selected on the test wafer. Further, the numbers of particles adhered onto the test wafer before and after the cleaning process were measured by using the light scattering-type defect detection device in which a particle diameter to be detected is set to about 0.25 μm to 0.40 μm. A particle removal rate (=((the number of particles before cleaning)−(the number of particles after cleaning))/(the number of particles before cleaning)×100(%)) was measured to be greater than about 90%.

What is claimed is:

1. A substrate cleaning method comprising the steps of:
   loading a substrate having a pattern formed on a surface thereof onto a mounting table inside a processing chamber;
   heating the substrate;
   supplying a cleaning fluid onto the surface of the substrate to remove residues remaining on the surface of the substrate,
   wherein the substrate is heated in said substrate heating step so that the Leidenfrost phenomenon occurs and steam of the cleaning fluid is interposed between the substrate and droplets of the cleaning fluid supplied to the substrate in said cleaning fluid supply step, and
   wherein the residues are moved upward by the steam of the cleaning fluid and removed from the surface of the substrate in said cleaning fluid supply step.

2. The substrate cleaning method of claim 1, wherein the cleaning fluid is supplied to the substrate in a mist form.

3. The substrate cleaning method of claim 1, wherein the substrate is heated to a temperature within a range from about 140 to 300° C. in said substrate heating step, and water is supplied as the cleaning fluid under atmospheric atmosphere in said cleaning fluid supply step.

4. The substrate cleaning method of claim 1, further comprising, before supplying the cleaning fluid to the substrate, depressurizing the processing chamber.

5. The substrate cleaning method of claim 1, wherein the cleaning fluid is at least one of water and an organic solvent.

6. A storage medium storing therein a program executed by a control unit for controlling a cleaning device, wherein the program is executed by the control unit to thereby control the cleaning device to perform a cleaning method, wherein the cleaning method comprises the steps of:
   loading a substrate having a pattern formed on a surface thereof onto a mounting table inside a processing chamber;
   heating the substrate;
   supplying a cleaning fluid onto the surface of the substrate to remove residues remaining on the surface of the substrate,
   wherein the substrate is heated in said substrate heating step so that the Leidenfrost phenomenon occurs and steam of the cleaning fluid is interposed between the substrate and droplets of the cleaning fluid supplied to the substrate in said cleaning fluid supply step, and
   wherein the residues are moved upward by the steam of the cleaning fluid and removed from the surface of the substrate in said cleaning fluid supply step.

7. The substrate cleaning method of claim 1, wherein said cleaning fluid supply step includes rotating the substrate about a rotational axis perpendicular to the surface of the substrate.

8. The substrate cleaning method of claim 7, wherein said rotating the substrate includes rotating the mounting table on which the substrate is loaded.

9. The substrate cleaning method of claim 1, wherein said cleaning fluid supply step includes moving a nozzle through which the cleaning fluid is supplied from a central portion of the substrate toward a peripheral portion thereof.

10. The substrate cleaning method of claim 7, wherein said cleaning fluid supply step includes moving a nozzle through which the cleaning fluid is supplied from a central portion of the substrate toward a peripheral portion thereof.

* * * * *